United States Patent [19]
Gonzalez et al.

[11] Patent Number: 6,090,727
[45] Date of Patent: *Jul. 18, 2000

[54] METHOD FOR LOCAL OXIDATION OF SILICON (LOCOS) FIELD ISOLATION

[75] Inventors: Fernando Gonzalez; Mike Violette, both of Boise, Id.

[73] Assignee: Micron Technology, Inc., Boise, Id.

[*] Notice: This patent is subject to a terminal disclaimer.

[21] Appl. No.: 08/906,409

[22] Filed: Aug. 5, 1997

Related U.S. Application Data

[63] Continuation of application No. 08/590,313, Jan. 23, 1996, Pat. No. 5,654,227.

[51] Int. Cl.[7] .................................................. H01L 21/469
[52] U.S. Cl. ........................ 438/791; 438/439; 438/297; 438/692; 438/764
[58] Field of Search ...................... 438/439, 699, 438/703, 692, 297, 764, 791

[56] References Cited

U.S. PATENT DOCUMENTS

| | | | |
|---|---|---|---|
| 4,462,846 | 7/1984 | Varshney | 437/69 |
| 4,818,235 | 4/1989 | Chao | 437/69 |
| 4,968,641 | 11/1990 | Kalnitsky et al. | 437/69 |
| 5,212,111 | 5/1993 | Doan et al. | 437/70 |
| 5,215,935 | 6/1993 | Nagao | 437/69 |
| 5,266,523 | 11/1993 | Manning | 437/193 |
| 5,358,892 | 10/1994 | Rolfson | 437/70 |
| 5,393,694 | 2/1995 | Mathews | 437/72 |
| 5,405,788 | 4/1995 | Manning et al. | 437/29 |
| 5,654,227 | 8/1997 | Gonzalez et al. | 438/439 |

FOREIGN PATENT DOCUMENTS

| | | | |
|---|---|---|---|
| 0251640 | 12/1985 | Japan | 437/70 |
| 0159240 | 7/1991 | Japan | 437/70 |
| 0280429 | 12/1991 | Japan | 437/70 |

*Primary Examiner*—Trung Dang

[57] ABSTRACT

A method for forming field oxide comprises the steps of forming a pad oxide layer over a semiconductor substrate, then forming a silicon layer over the pad oxide layer. A patterned mask is formed over the silicon layer and the silicon layer is etched to form openings in the silicon layer. Next, a blanket nitride layer is formed over the silicon and within the openings, and the nitride layer is then planarized to remove the nitride which overlies the silicon which leaves the nitride in the openings. Subsequent to the step of planarizing the nitride, the silicon layer is removed thereby forming openings in the nitride layer. The substrate is oxidized at the openings in the nitride layer to form field oxide from the substrate.

32 Claims, 2 Drawing Sheets

METHOD FOR LOCAL OXIDATION OF SILICON (LOCOS) FIELD ISOLATION

This is a continuation of U.S. patent application Ser. No. 08/590,313 filed Jan. 23, 1996 and issued Aug. 5, 1997 as U.S. Pat. No. 5,654,227.

FIELD OF THE INVENTION

This invention relates to the field of semiconductor manufacture, and more particularly to a method for forming an isolation layer such as field oxide over a substrate such as silicon.

BACKGROUND OF THE INVENTION

Current methods of semiconductor manufacture comprise a process known as "LOCOS," or local oxidation of silicon. Various LOCOS and LOCOS-related processes are described in the following U.S. Patents, each of which is assigned to Micron Technology, Inc. and incorporated herein by reference: U.S. Pat. No. 5,212,111 to Doan, et al; U.S. Pat. No. 5,266,523 to Manning; U.S. Pat. No. 5,358,892 to Rolfson; U.S. Pat. No. 5,393,694 to Mathews; and U.S. Pat. No. 5,405,788 to Manning, et al. With a typical LOCOS process, a thin "pad oxide" layer is formed over a typically silicon substrate, and a patterned nitride layer such as silicon nitride is formed over the pad oxide. The surface of the substrate is then exposed to oxidizing agents. As the formation of oxide under the nitride is inhibited, the substrate oxidizes to form a thicker oxide only in those areas of the substrate uncovered by the nitride. Some encroachment or "bird's beak" under the nitride can also occur which becomes more of a problem as line widths decrease. As line widths decrease, encroachment decreases the width of a channel under a transistor gate to a greater percentage than with a larger device having wider line widths.

Various steps have been taken to decrease encroachment. For example, because thicker pad oxide under the nitride encourages encroachment the pad oxide thickness is decreased. The pad oxide must be thick enough, however, to protect the substrate during formation of the patterned nitride. If the pad oxide is too thin, it can be completely removed in some areas of the substrate when a blanket nitride layer is etched to form the patterned layer and then the silicon substrate will begin to be etched. Etching the silicon is to be avoided as later oxidation of previously etched and pitted substrate forms defects in the silicon which degrades integrated circuit (IC) electrical characteristics.

A process which allows for a thin pad oxide to decrease encroachment and is less susceptible to damaging the substrate from an excessively thin pad oxide would be desirable.

SUMMARY OF THE INVENTION

One embodiment of a method for forming a semiconductor device comprises the steps of forming a first layer over a substrate, then forming a patterned second layer having openings over the first layer and over the substrate. A patterned second layer having openings is formed over the first layer and over the substrate, and a patterned third layer is formed at the openings of the second layer. The patterned second layer is removed and the third layer, which has openings therein, remains.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

One embodiment of the invention is described in FIGS. 1–5. A method for forming a semiconductor device comprises the steps of forming a first layer 10 such as a dielectric of pad oxide over a substrate 12 such as silicon. A pad oxide about 120 angstroms (Å) or less, for example about 60 Å, would be sufficient although other thicknesses would be possible. Various substrates other than a wafer substrate are possible, such as to form contacts to other layers, in which case the pad oxide may not be required.

Figure 2:
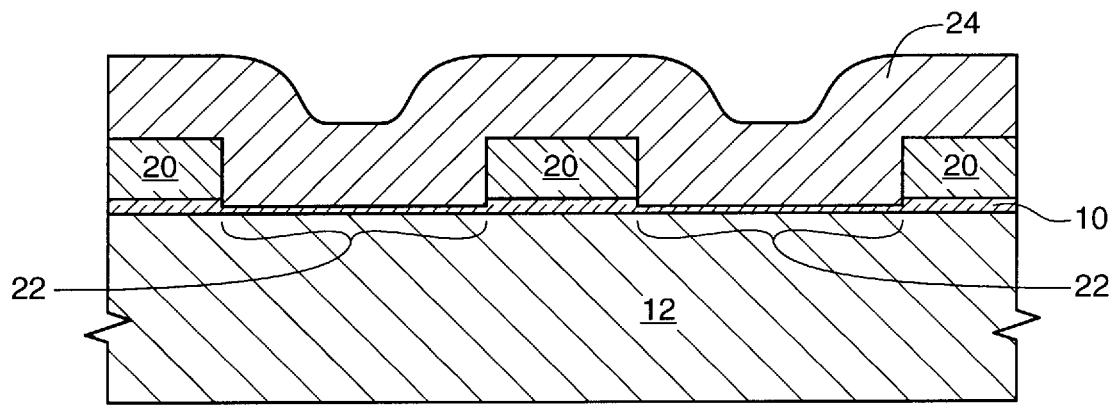

A blanket sacrificial second layer 14, for instance doped or undoped polycrystalline silicon is formed over the first layer 10 and over the substrate 12. A patterned photoresist layer 16 is formed over the blanket sacrificial layer 14, then a vertical (anisotropic) etch is performed to pattern the blanket second layer 14 to result in the patterned second layer 20 as shown in FIG. 2. The second layer 20 comprises openings 22 therein resulting from being patterned. A sacrificial layer of about 2500 Å or less would be sufficient.

Subsequently, a blanket third layer 24 is formed over the sacrificial layer 20 at the openings 22 of the second layer 20. The third layer 24, such as an oxidation-resistant layer of silicon nitride, is planarized using a method such as chemical mechanical polishing (CMP) or other means. This results in the structure of FIG. 3 having a patterned third layer 30 formed at the openings 22 of the second layer 20. The sacrificial second layer 20 may also be etched somewhat to result in sacrificial and oxidation-resistant layers which are about 1900 Å thick, although other thicknesses would be sufficient.

Figure 4:
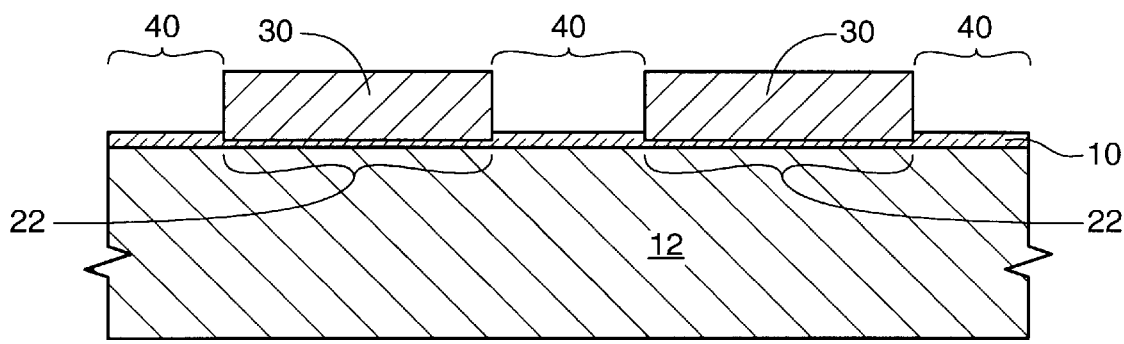

Next, at least a portion of the patterned second layer 20 is removed as shown in FIG. 4, for example by using a wet etch. At least a portion of the patterned third layer 30 remains and has openings therein 40 as shown. The openings 40 in the third layer 30 in this embodiment result from the removal of the second layer, although other means of forming the openings may be possible. Subsequent to removing the second layer an insulation material 50 is formed from portions of the substrate 12 which are uncovered by the patterned third layer 30, for example by oxidizing the substrate to form field oxide. If any of the first layer 10 remains, the portions of the first layer uncovered by the third layer are also consumed during the oxidation process.

Figure 1:
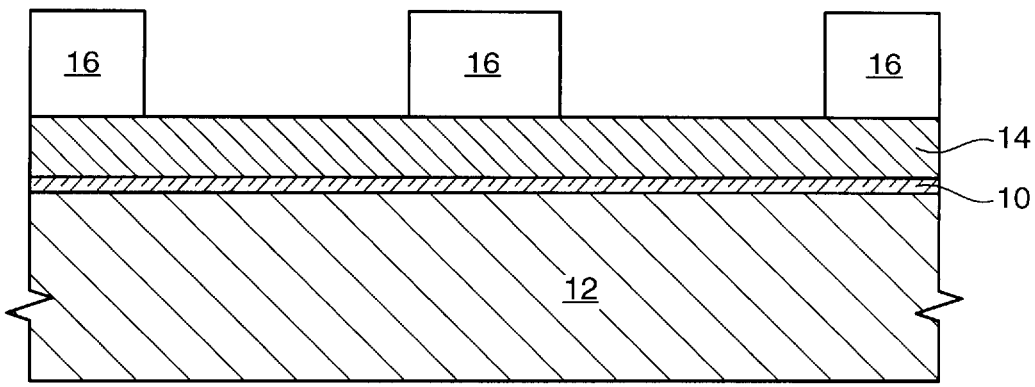
FIGS. 1–5 are cross sections showing various steps during one inventive embodiment of the invention.
Figure 5:
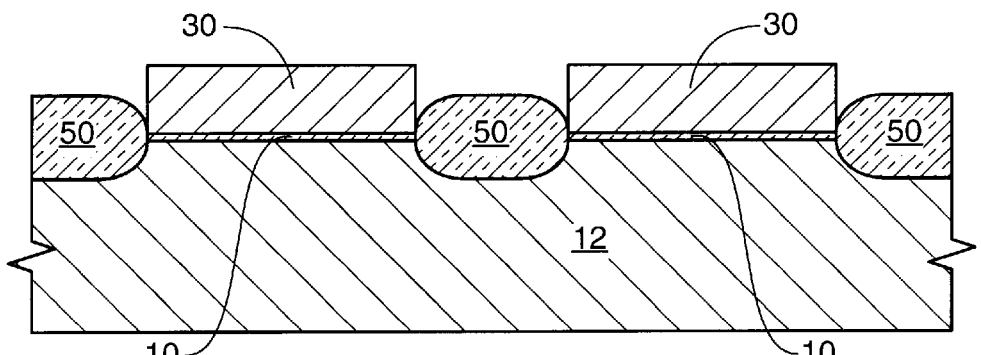
Figure 6:
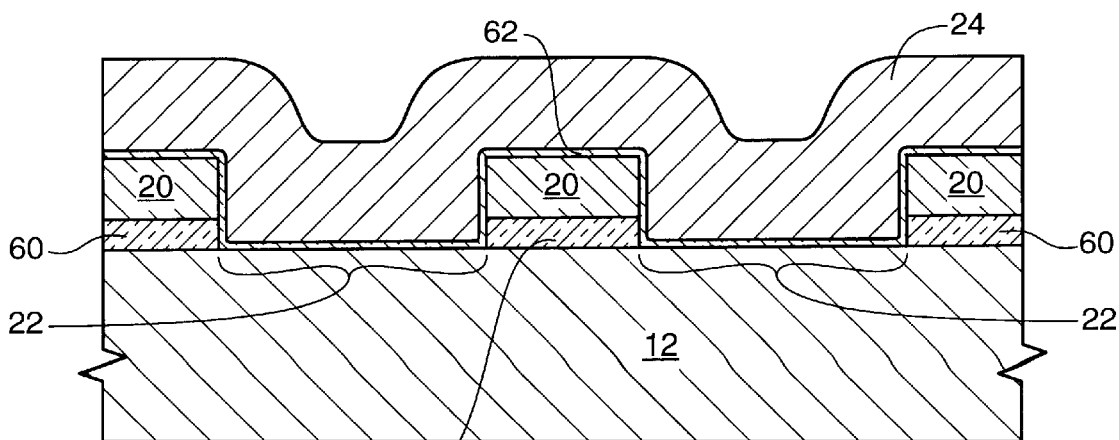
FIG. 6 is intermediate step in a second embodiment of the invention.

The pad oxide must be thick enough to minimize any etching of the substrate during patterning of the second layer (the poly layer) during the etch of the FIG. 1 structure. However, a thick oxide is to be avoided during the formation of the insulation material as shown in FIG. 5 as a thick oxide under the third layer encourages encroachment of the field oxide under the third layer. In an alternate embodiment as shown in FIG. 6 a thick first layer 60 (pad oxide), for example a layer about 60 Å or greater, can be formed which is removed from the openings 22 during the etch of layer 20. A portion of the first layer 60 remains after the etch and is covered by the second layer 20. Before forming the third layer, a thin oxide layer 62 such as a thermal oxide layer of about 30 Å or greater is formed at the openings 22 of the second layer 20. This layer 62 is thinner than the pad oxide 60. The third layer 24 is formed over this oxide layer 62, and the wafer processing continues by planarizing the third layer 24. This allows for a thick pad oxide 10 to protect the substrate surface as the second layer is etched, but allows for a thin oxide 62 under the third layer 24 during the formation of the field oxide to minimize encroachment of the field oxide under the third layer.

Figure 3:
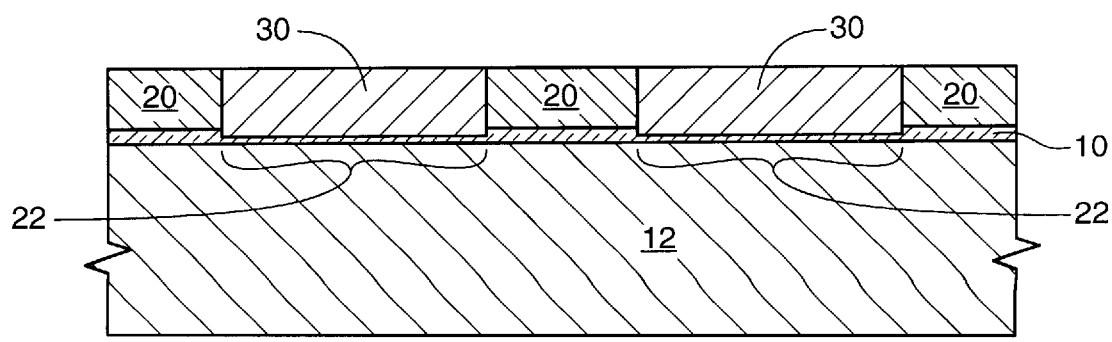

In yet another embodiment, referring to FIG. 3, an oxidizible layer 20 such as a poly layer is not removed but is instead oxidized to result in a structure similar to that of FIG. 5. This, in effect, removes the conductive poly layer 20 while requiring one less etch step than the prior embodiments. This may form a very thick oxide layer, for example field oxide, but this embodiment may function sufficiently with some uses of the invention.

With the instant invention, the etch ratio of the second layer (for example poly) to the first layer (pad oxide) is higher than the etch ratio of the third layer (nitride) to the first layer. For example, the etch ratio of polycrystalline silicon to pad oxide is from about 12:1 to about 15:1 and the etch ratio of silicon nitride to pad oxide is from about 6:1 to about 8:1. The etch ratio of poly to pad oxide can be changed by doping the poly, and the etch ratio depends on the type of etch used. With prior processes, the nitride is etched with an anisotropic etch and it is more difficult to remove the nitride and to not overetch the pad oxide. Thus with prior processes a thicker pad oxide must be formed to ensure that the substrate is not etched, but a thicker pad oxide encourages encroachment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, etches other than the ones described herein can be used, and planarizing may be accomplished by methods other than chemical mechanical polishing. Similarly, materials other than polycrystalline silicon and silicon nitride may be used. It is therefore contemplated that the appended claims will cover any such modifications or embodiments as fall within the true scope of the invention.

What is claimed is:

1. A method used during the formation of a semiconductor device comprising the following steps:
   providing a semiconductor substrate having a first layer thereover;
   forming a sacrificial patterned second layer having openings therein wherein said second layer overlies said first layer;
   forming a blanket third layer over said second layer and within said openings in said second layer;
   removing said third layer which overlies said second layer and leaving at least a portion of said third layer within said openings;
   removing said sacrificial second layer, wherein at least a portion of said third layer remains after removing said sacrificial second layer.

2. The method of claim 1 further comprising the step of exposing said first layer during said step of removing said sacrificial second layer.

3. The method of claim 1 further comprising the following steps:
   prior to said step of forming said second layer, forming a fourth layer over said first layer such that subsequent to forming said second layer said fourth layer is interposed between said first layer and said second layer;
   subsequent to said step of removing said sacrificial second layer, etching said fourth layer and exposing said first layer.

4. The method of claim 3 further comprising the step of forming a contact to said first layer subsequent to said step of exposing said first layer.

5. The method of claim 1 further comprising the step of planarizing said second and third layers such that said second and third layers form a generally planar surface during said step of removing said third layer which overlies said second layer.

6. The method of claim 1 wherein said step of removing said sacrificial second layer forms openings in said third layer.

7. The method of claim 1 wherein said first layer is a conductor, said second layer comprises silicon, and said third layer is a dielectric.

8. A method used during the formation of a semiconductor device comprising the following steps:
   forming a pad oxide layer over a semiconductor substrate assembly;
   forming a patterned layer having openings therein over said pad oxide layer;
   forming a blanket layer over said patterned layer and within said openings;
   planarizing said blanket layer and said patterned layer such that said blanket layer and said patterned layer form a generally planar surface;
   subsequent to said step of planarizing, removing said patterned layer thereby forming openings in said blanket layer.

9. The method of claim 8 further comprising the step of oxidizing said substrate assembly at said openings in said blanket layer.

10. The method of claim 9 wherein said step of oxidizing said substrate assembly forms field oxide.

11. The method of claim 8 wherein said pad oxide layer is a first oxide layer, further comprising the step of forming a second oxide layer over said patterned layer and over said first oxide layer prior to said step of forming said blanket layer.

12. The method of claim 11 wherein said pad oxide layer is substantially thicker than said second oxide layer.

13. The method of claim 11 further comprising the step of removing said pad oxide layer under said patterned layer subsequent to said step of removing said patterned layer.

14. A method of forming a mask layer during the formation of a semiconductor device comprising the following steps:
   providing an underlying layer having regions to be exposed;
   forming a patterned sacrificial layer over said regions to be exposed, said patterned layer having openings therein wherein said openings overlie regions which are to be unexposed;
   forming a mask layer in said openings, wherein an etch ratio of said sacrificial layer to said underlying layer is higher than an etch ratio of said mask layer to said underlying layer; and
   subsequent to forming said mask layer, removing said sacrificial layer.

15. The method of claim 14 further comprising the step of exposing said regions to be exposed during said step of removing said sacrificial layer.

16. The method of claim 14 wherein said step of forming said mask layer in said openings comprises the following steps:

forming a blanket mask layer within said openings and over said sacrificial layer; and planarizing said blanket mask layer and removing said blanket mask layer from over said sacrificial layer.

17. The method of claim 16 wherein said step of planarizing includes chemical mechanical planarization which removes said blanket mask layer from over said sacrificial layer and further removes a portion of said sacrificial layer.

18. A method of forming a mask layer during the formation of a semiconductor device comprising the following steps:

providing an underlying layer having regions to be exposed;

forming a patterned sacrificial layer over said regions to be exposed, said patterned layer having openings therein wherein said openings overlie regions which are to be unexposed;

forming a blanket mask layer within said openings and over said sacrificial layer;

planarizing said blanket mask layer using a chemical mechanical planarization process to remove said blanket mask layer from over said sacrificial layer and to remove a first portion of said sacrificial layer; and subsequent to forming said mask layer, removing a second portion of said sacrificial layer.

19. The method of claim 18 further comprising the step of exposing said regions to be exposed during said step of removing said sacrificial layer.

20. The method of claim 19 further comprising the step of oxidizing said exposed regions subsequent to said step of removing said second portion of said sacrificial layer.

21. A method used during the formation of a semiconductor device comprising the following steps:

providing a semiconductor substrate assembly;

providing a dielectric layer overlying said semiconductor substrate assembly;

forming a patterned layer having openings therein over said dielectric layer;

forming a blanket layer overlying said patterned layer and formed within said openings;

removing said blanket layer from over said patterned layer and leaving at least a portion of said blanket layer within said openings; and subsequent to said step of removing said blanket layer from over said patterned layer, removing said patterned layer, wherein an etch ratio of said patterned layer to said dielectric layer is greater than an etch ratio of said blanket layer to said dielectric layer.

22. The method of claim 21 wherein said step of removing said blanket layer comprises chemical mechanical planarization of said blanket layer.

23. The method of claim 22 further comprising the step of removing a portion of said sacrificial layer during said chemical mechanical planarization of said blanket layer.

24. The method of claim 21 further comprising the following steps:

providing a pad oxide layer during said step of forming said dielectric layer;

providing a polycrystalline silicon layer during said step of forming said patterned layer; and forming a nitride layer during said step of forming said blanket layer.

25. The method of claim 21 further comprising the step of exposing dielectric layer during said step of removing said patterned layer.

26. The method of claim 21 further comprising the following steps:

forming a pad oxide layer having a first thickness during said step of providing a dielectric layer; and subsequent to said step said of forming said patterned layer, and prior to said step of forming said blanket layer, forming a second dielectric layer having a second thickness which is less than said first thickness.

27. The method of claim 26 further comprising the following steps:

during said step of forming said pad oxide layer, forming a pad oxide layer having a thickness greater than about 60 Å; and during said step of forming said second dielectric layer, forming a thermal oxide layer having a thickness greater than about 30 Å.

28. The method of claim 21 further comprising the step of oxidizing said semiconductor substrate assembly thereby forming field oxide subsequent to said step of removing said blanket layer.

29. A method used during the formation of a semiconductor device comprising the following steps:

providing an underlying layer of material having regions to be exposed;

forming a patterned sacrificial layer over said regions of said underlying layer to be exposed, said sacrificial layer having openings therein wherein said openings overlie regions which are to be unexposed;

forming a mask layer in said openings; and subjecting said sacrificial layer, said mask layer, and said underlying layer to an etch, wherein said etch removes said sacrificial layer and wherein an etch ratio of said sacrificial layer to said underlying layer is higher than an etch ratio of said mask layer to said underlying layer.

30. The method of claim 29 wherein said step of forming said mask layer in said openings comprises the following steps:

providing a blanket mask layer over said sacrificial layer and within said openings;

using a chemical mechanical polishing process, planarizing said blanket mask layer such that said mask layer is removed from over said sacrificial layer and remains within said openings.

31. The method of claim 30 wherein said step of planarizing said blanket mask layer further comprises the step of forming generally coplanar upper surfaces of said mask layer and said sacrificial layer.

32. The method of claim 29 wherein said underlying layer is a pad oxide layer formed over a semiconductor wafer, further comprising the following steps:

subsequent to said step of subjecting said sacrificial layer, said mask layer, and said underlying layer to said etch, oxidizing said wafer at said regions of pad oxide layer to be exposed; and subsequent to said step of oxidizing said wafer, removing said mask layer.

* * * * *